(12) United States Patent  (10) Patent No.: US 7,619,480 B2
North  (45) Date of Patent: Nov. 17, 2009

(54) DISTRIBUTED CLASS G TYPE AMPLIFIER SWITCHING METHOD

(75) Inventor: Brian B. North, Los Gatos, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/128,092

(22) Filed: May 28, 2008

(65) Prior Publication Data

US 2008/0258811 A1  Oct. 23, 2008

Related U.S. Application Data

(63) Continuation of application No. 11/688,822, filed on Mar. 20, 2007, now Pat. No. 7,408,414.

(60) Provisional application No. 60/784,638, filed on Mar. 21, 2006.

(51) Int. Cl.
 *H03G 3/20* (2006.01)
(52) U.S. Cl. .................... 330/297; 330/251
(58) Field of Classification Search ................. 330/297, 330/251, 257, 263, 295, 302, 307, 284, 298; 333/81 R
 See application file for complete search history.

(56) References Cited

U.S. PATENT DOCUMENTS

| | | | |
|---|---|---|---|
| 4,030,045 A | 6/1977 | Clark | |
| 4,324,950 A | 4/1982 | Strickland | |
| 5,038,325 A | 8/1991 | Douglas et al. | |
| 5,072,171 A | 12/1991 | Eng | |
| 5,115,203 A | 5/1992 | Krett et al. | |
| 5,347,171 A | 9/1994 | Cordoba et al. | |

(Continued)

FOREIGN PATENT DOCUMENTS

WO  WO 97/23005 A1  6/1997

(Continued)

OTHER PUBLICATIONS

"TDA7563 Multifunction Quad Power Amplifier with Built-In Diagnostics Features," May 2003. ST Microelectronics.

(Continued)

*Primary Examiner*—Robert Pascal
*Assistant Examiner*—Hieu P Nguyen
(74) *Attorney, Agent, or Firm*—Schwegman, Lundberg & Woessner P.A.

(57) ABSTRACT

An improved Class G type amplifier is provided which switches between multiple power rails depending upon the instantaneous amplitude of the input signal versus the power rails without excessive distortion. The low voltage (inner) amplifier includes a plurality of parallel amplifier devices, and the high voltage (outer) amplifier includes a plurality of parallel amplifier devices. A plurality of switches each couples the input signal to either a respective one of the inner amplifier devices or a respective one of the outer amplifier devices. The switches are activated sequentially, such that the switching from inner amplifier devices to outer amplifier devices or vice versa is staggered over time. This avoids having a single, large glitch in the output and spreads multiple smaller glitches over enough time so that some of the radiated glitch energy can fall within frequencies where amplifier feedback circuitry can eliminate its noise. The switches are sequentially activated by a series of delay elements.

8 Claims, 7 Drawing Sheets

U.S. PATENT DOCUMENTS

| | | | |
|---|---|---|---|
| 5,491,839 | A | 2/1996 | Schotz |
| 5,694,072 | A | 12/1997 | Hsiao |
| 6,028,486 | A * | 2/2000 | Andre .................. 330/297 |
| 6,107,886 | A | 8/2000 | Kusakabe |
| 6,215,356 | B1 | 4/2001 | Servaes et al. |
| 6,256,482 | B1 | 7/2001 | Raab |
| 6,304,138 | B1 | 10/2001 | Johnson |
| 6,323,729 | B1 | 11/2001 | Sevenhans et al. |
| 6,417,736 | B1 | 7/2002 | Lewyn |
| 6,486,733 | B2 | 11/2002 | Myers et al. |
| 6,504,426 | B2 | 1/2003 | Picha et al. |
| 6,538,514 | B2 | 3/2003 | Harvey |
| 6,614,310 | B2 | 9/2003 | Quarfoot et al. |
| 6,636,103 | B2 | 10/2003 | Wurcer et al. |
| 6,815,988 | B2 | 11/2004 | Sanduleanu |
| 6,838,942 | B1 | 1/2005 | Somerville et al. |
| 6,853,244 | B2 | 2/2005 | Robinson et al. |
| 6,975,175 | B2 | 12/2005 | Sanduleanu |
| 6,982,600 | B2 | 1/2006 | Harvey |
| 6,987,417 | B2 | 1/2006 | Winter et al. |
| 6,993,302 | B2 | 1/2006 | Bausov et al. |
| 6,998,914 | B2 | 2/2006 | Robinson |
| 7,026,868 | B2 | 4/2006 | Robinson et al. |
| 7,034,614 | B2 | 4/2006 | Robinson et al. |
| 7,042,284 | B2 | 5/2006 | Moons et al. |
| 7,043,213 | B2 | 5/2006 | Robinson et al. |
| 7,106,135 | B2 | 9/2006 | Makino et al. |

FOREIGN PATENT DOCUMENTS

| | | | |
|---|---|---|---|
| WO | WO 00/00983 | A1 | 1/2000 |

OTHER PUBLICATIONS

MAX9730 "2.4W, Single-Supply, Class G Amplifier," Dec. 2006, Maxim Integrated Products.
International Search Report PCT/US07/064546.
International Search Report PCT/US07/064549.
International Search Report PCT/US07/064548.
International Search Report PCT/US07/064545.

* cited by examiner

DISTRIBUTED CLASS G TYPE AMPLIFIER SWITCHING METHOD

CROSS-REFERENCES TO RELATED APPLICATIONS

The present application is a continuation of patent application Ser. No. 11/688,822 filed Mar. 20, 2007, now U.S. Pat. No. 7,408,414 issued Aug. 5, 2008, and claims benefit under 35 U.S.C. 119(e) of U.S. provisional Application No. 60/784,638, filed on Mar. 21, 2006, entitled "Adaptive Biasing Based on Volume Control Setting," the contents of both are incorporated herein by reference in its entirety.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

This invention relates generally to electronic amplifiers, and more specifically to means for reducing switching glitches in amplifiers which switch between multiple power rails.

Class AB amplifiers use two amplifier devices in a push-pull configuration, with both amplifier devices biased slightly on, to avoid distortion glitches at the crossover. The amplifier is driven with a fixed, predetermined pair of power rails, typically VDD and GND. Class AB amplifiers are not especially efficient, and waste considerable power due to significant quiescent currents.

Class G amplifiers are a form of improved and more efficient version of Class AB amplifiers designed to reduce this inefficiency. Class G amplifiers are provided with more than two power rails and are switched between power rails depending upon the input signal, gain setting, and the like. The general principle of Class G is to use the lowest power rails that will provide adequate power at the particular instant. A Class G amplifier draws power from low voltage supply rails for generating small output signals and only uses high voltage supply rails for the peak output signal excursions.

A known problem with Class G amplifiers is the occurrence of so-called glitches or discontinuities in output at the "crossover" or "handoff" point where the output signal current switches between an inner (low voltage) to an outer (high voltage) power supply rail. These glitches cause increased distortion and possible EMI related problems. The glitches are caused by inevitable mismatches in the gains between the two signal paths and the finite, non-zero time required to divert the source of the output signal current from one set of power supplies to another. The switching is typically done very abruptly to minimize the energy of the glitch. However, this abruptness causes the spurious radiation at frequencies outside the bandwidth of the amplifier and thus not susceptible to being reduced by the negative feedback mechanisms used to linearize other aspects of the amplifier.

FIG. 1 is of a prior art device illustrating one example of a conventional Class G amplifier 10. The amplifier 10 is provided with two pairs of power rails: a high voltage pair $V_{DD}$ to $V_{SS}$, and a low voltage pair $V_{DDL}$ to $V_{SSL}$. (Voltage supplies and bias generators are well-known in the art, and thus are omitted from FIG. 1 for the sake of clarity in the illustration.)

The amplifier includes a positive side outer current mirror $CM_1$ coupled to the high voltage positive power rail $V_{DD}$, a positive side inner current mirror $CM_2$ coupled to the low voltage positive power rail $V_{DDL}$, a (relatively) negative side inner current mirror $CM_3$ coupled to the low voltage negative power rail $V_{SSL}$, and a (relatively) negative side outer current mirror $C_{M4}$ coupled to the high voltage negative power rail $V_{SS}$.

A transconductance amplifier (gm Amp) is coupled to receive an input signal $V_{IP}$; typically this is one-half of a $V_{IP}/V_{IN}$ differential input pair, one of which is tied to an analog ground point. A current sink output of the transconductance amplifier is fed to the input of a positive side switching device 12. The two outputs of the positive side switching device are respectively coupled to the inputs of the positive side current mirrors. The outputs of the positive side inner and outer current mirrors are both coupled to the amplifier's output terminal $V_{OUT}$, and the output of the positive side outer current mirror is also coupled to a positive input of a positive side comparator 14. The negative input of the positive side comparator is coupled to a threshold voltage reference that tracks the positive side low voltage power rail. The threshold voltage is set to a value that just prevents the inner rail output stage from saturating before passing control to the outer rail output stage, which is typically around 200 mV. The output of the positive side comparator is coupled to control the positive side switching device.

The negative side or half of the amplifier is a mirror image of the positive side, using a negative side switching device 16 and a negative side comparator 18.

FIG. 2 is a prior art illustration of the output current provided by the positive side lower supply (inner current mirror) in response to a particular input signal. As the input signal rises, the inner current mirror's output current rises accordingly until, at a particular point 20 the inner current mirror's power rails are inadequate, and the inner current mirror is switched off.

FIG. 3 is a prior art illustration of the output current provided by the positive side upper supply (outer current mirror) in response to that same input signal. As long as the inner current mirror's power rails are adequate, the outer current mirror is not utilized until at the point 20, when the positive side comparator triggers the positive side switch to turn the positive side inner current mirror off and the positive side outer current mirror on. Then the positive side outer current mirror provides the current for the output signal until, at a particular point 22 the input signal falls enough that the inner current mirror's power rails are again adequate. At that point, the positive side comparator triggers the positive side switch to turn the positive side outer current mirror off and the positive side inner current mirror on, as shown in FIG. 2.

FIG. 4 is a prior art illustration of the composite output current provided by the combination of the positive side inner and outer current mirrors in response to that input signal. The "on" portions of the two waveforms of FIGS. 2 and 3 would ideally form a smooth, glitch-free waveform when combined. However, due to problems inherent in Class G amplifiers, switching glitches do appear in the output current waveform at the points 20, 22 where the amplifier switches between current mirrors.

FIG. 5 is a prior art illustration of a waveform demonstrating the output 24 of a positive side inner supply and the output 26 of a positive side outer supply, particularly showing them crossing over at a point 28 when the inner supply's power rails have just become inadequate.

FIG. 6 is a prior art illustration of a waveform of the composite output 30 provided by the positive side inner and outer supplies, magnified to particularly show the large glitch 32 produced at the crossover (at point 28 in FIG. 5).

What is needed, then, is an improved Class G amplifier and method of operating it, which reduces, minimizes, or eliminates such switching glitches.

SUMMARY OF THE INVENTION

According to the invention, an improved Class G type amplifier is provided which switches between multiple power rails depending upon the instantaneous amplitude of the input signal versus the power rails without excessive distortion. The low voltage (inner) amplifier includes a plurality of parallel amplifier devices, and the high voltage (outer) amplifier includes a plurality of parallel amplifier devices. A plurality of switches each couples the input signal to either a respective one of the inner amplifier devices or a respective one of the outer amplifier devices. The switches are activated sequentially, such that the switching from inner amplifier devices to outer amplifier devices or vice versa is staggered over time. This avoids having a single, large glitch in the output and spreads multiple smaller glitches over enough time so that some of the radiated glitch energy can fall within frequencies where amplifier feedback circuitry can eliminate its noise. The switches are sequentially activated by a series of delay elements.

The invention will be better understood by reference to the following detailed description in connection with the accompanying drawings.

DETAILED DESCRIPTION OF SPECIFIC EMBODIMENTS OF THE INVENTION

Figure 7:
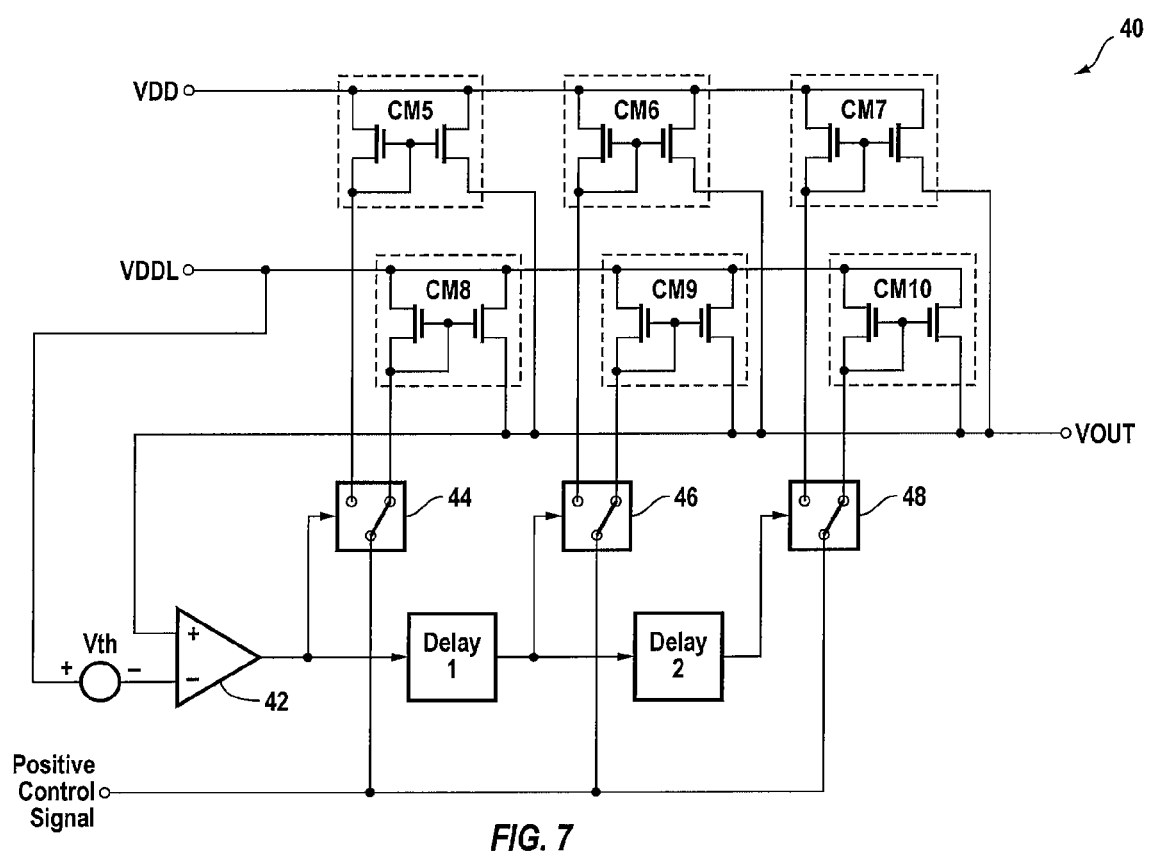
FIG. 7 shows an improved Class G amplifier according to one embodiment of the present invention.

FIG. 7 illustrates the positive side of an improved Class G amplifier 40 according to one embodiment of this invention. For clarity in the illustration, only the positive side of the amplifier is shown in FIG. 7; those of ordinary skill in the art will, armed with the teachings of this disclosure, be able to readily construct an amplifier having both positive and negative sides utilizing the principles of this invention.

Instead of a single positive side inner current mirror and a single positive side outer current mirror which are switched in an instantaneous, binary on/off manner, the present invention uses a plurality of such devices which are switched in a staggered manner, to achieve significant reductions in glitch generation.

The positive side outer supply includes a plurality of current mirrors coupled in parallel, and the positive side inner supply includes a plurality of current mirrors coupled in parallel. In the example shown, there are three outer current mirrors $CM_5$, $CM_6$, $CM_7$, and three inner current mirrors $CM_8$, $CM_9$, $CM_{10}$, by way of illustration only. In practice, any number of current mirrors greater than one may be employed. It is not necessary for there to be the same number of inner and outer current mirrors. For example, there may an extra outer current mirror which is always on. It is desirable that the transfer function gain when switching from the inner rail to the outer rail (and vice-versa) remains as constant as possible during the transition.

The outer current mirrors are powered by the positive side high voltage rail $V_{DD}$, and the inner current mirrors are powered by the positive side low voltage rail $V_{DDL}$. The outputs of all the current mirrors are coupled in parallel to the amplifier (stage) output terminal $V_{OUT}$.

Figure 1:
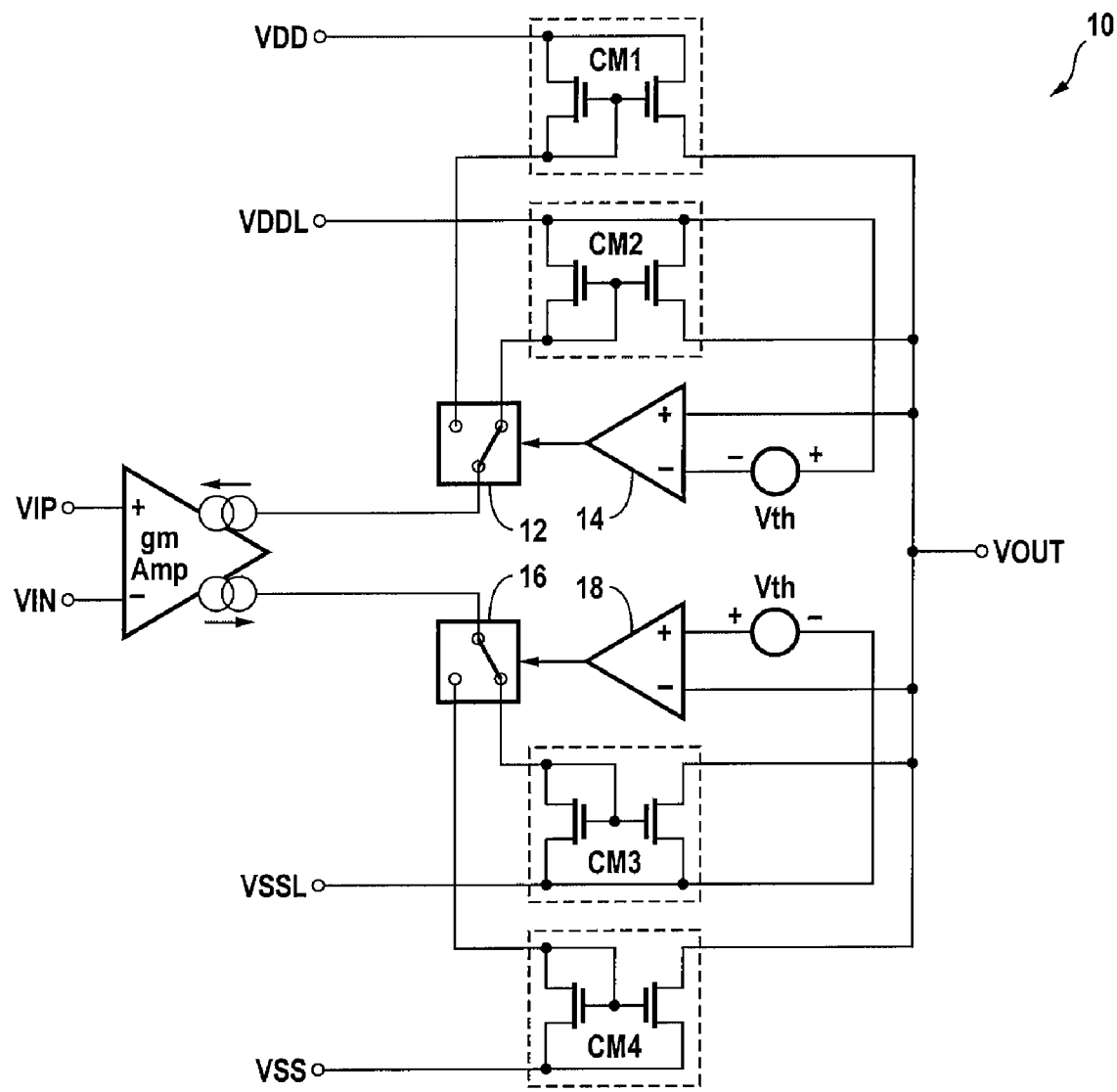
FIG. 1 shows a Class G amplifier according to the prior art.
Figure 2:
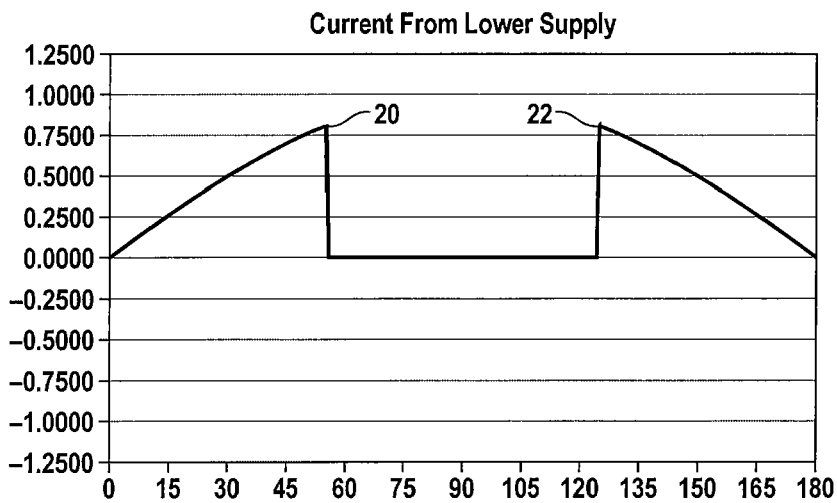
FIGS. 2, 3 and 4 show waveforms of the positive side inner current mirror output, the outer current mirror output, and the combined output, respectively of FIG. 1.
Figure 3:
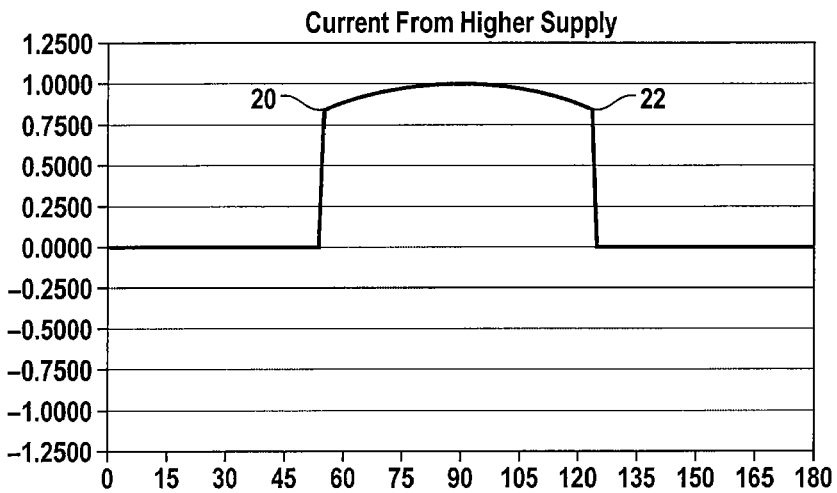
Figure 4:
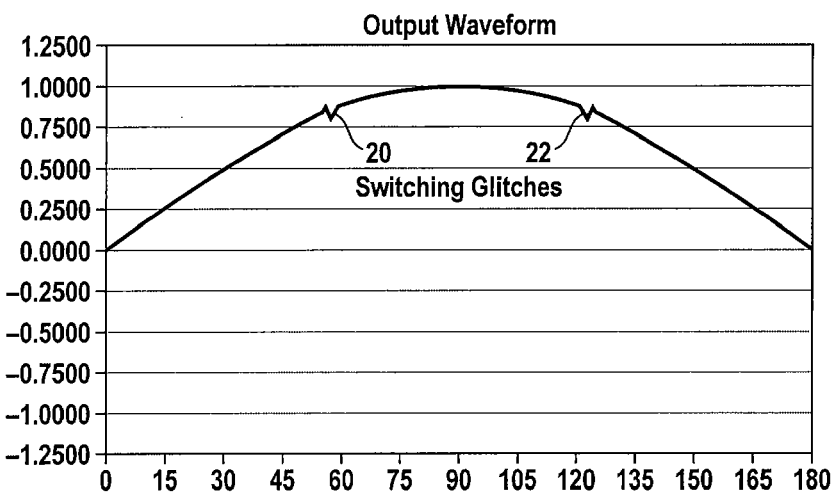
Figure 5:
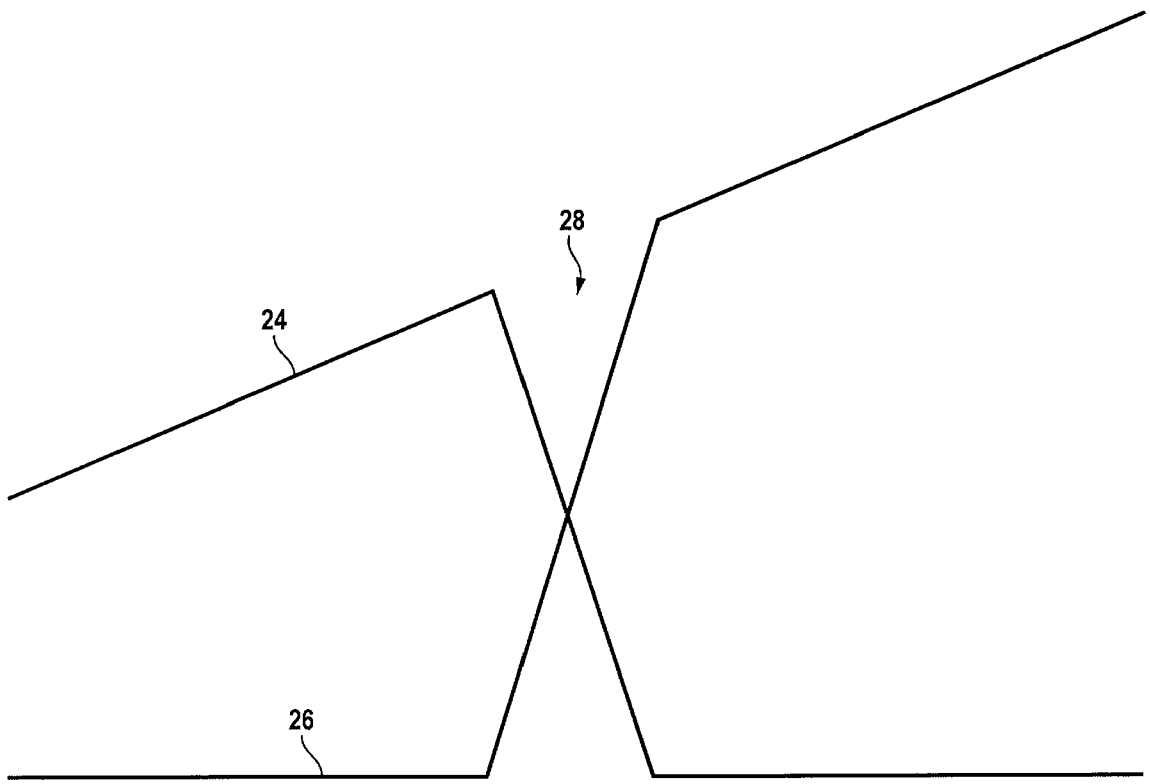
FIG. 5 shows another waveform demonstrating the crossover of the inner and outer current mirror outputs of a conventional Class G amplifier.

The inputs of the current mirrors are coupled in parallel to receive a positive control signal, which is the signal input to this amplifier stage. If this is the first stage, the positive control signal is the $V_{IN}$ or $V_{INP}$ signal (or, in the context of an implementation similar to the FIG. 1 art, it is the upper output of the transconductance amplifier. If this is a later stage, the positive control signal is an intermediate signal which is the output of the immediately preceding amplifier stage.

The amplifier includes a comparator 42 which has its positive input coupled to the $V_{OUT}$ terminal (and thus to the outputs of the positive side current mirrors) and its negative input coupled to a threshold voltage reference which tracks $V_{DDL}$.

The output of the positive side comparator is coupled to control a first positive side switching device 44. The two outputs of the switch are coupled to the inputs of the first outer current mirror $C_{M5}$ and the first inner current mirror $C_{M8}$, respectively.

The output of the positive side comparator is also fed to a first delay device (delay 1) which delays the signal by a predetermined amount of time and then feeds the delayed signal to control a second positive side switching device 46. The two outputs of the second switch are coupled to the inputs of the second outer current mirror $C_{M6}$ and the second inner current mirror $C_{M9}$, respectively.

The output of the first delay device is also fed to a second delay device (delay 2), which delays the signal by a predetermined amount of time and then feeds the again-delayed signal to control a third positive side switching device 48. The two outputs of the third switch are coupled to the inputs of the third outer current mirror $C_{M7}$ and the third inner current mirror $CM_{10}$, respectively.

Thus, rather than having one pair of large current mirrors do a crossover all at once, the present invention spreads the crossover over multiple, staggered, smaller current mirrors. This reduces the magnitude of any particular glitch component, spreads the components over a period of time, and reduces the overall glitch.

Figure 8:
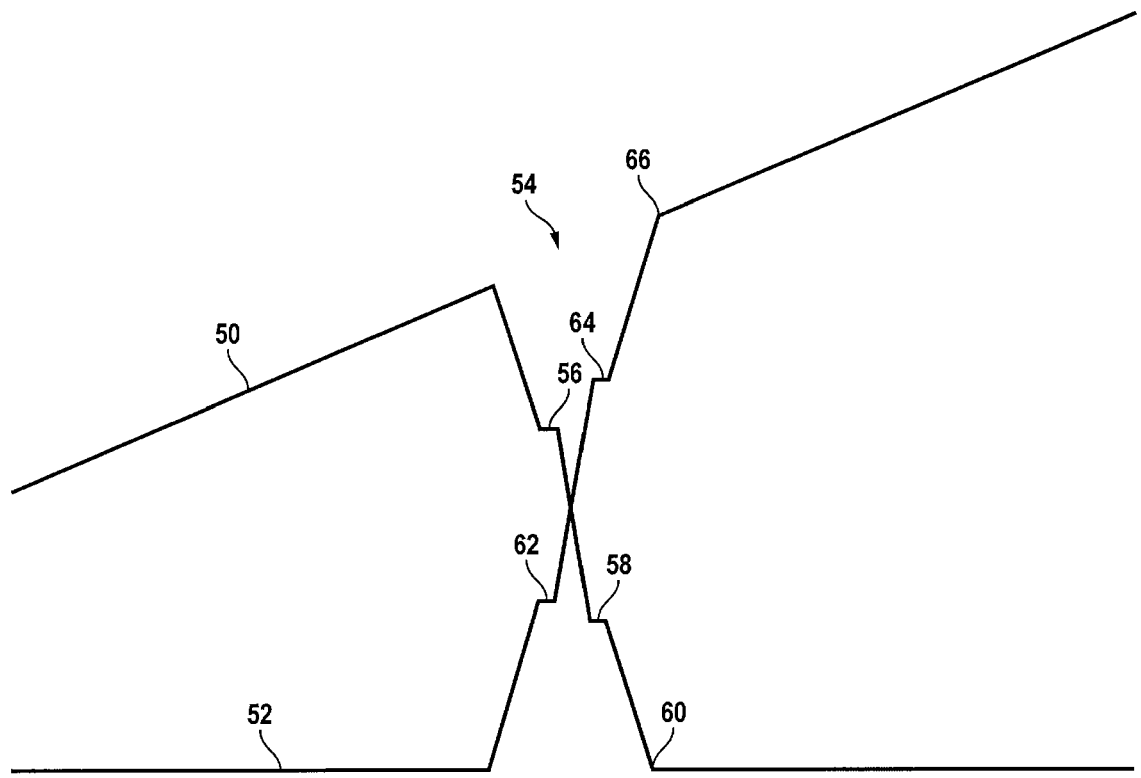
FIG. 8 shows a waveform demonstrating the crossover of the inner and outer current mirror outputs of the improved Class G amplifier of FIG. 7.

FIG. 8 illustrates a waveform demonstrating the composite output 50 of the positive side inner current supplies and the composite output 52 of the positive side outer current supplies. It particularly shows the crossover 54 region, including the steps 56, 58, 60 where the successive inner devices are switched off and the steps 62, 64, 66 where the successive outer devices are switched on.

Figure 6:
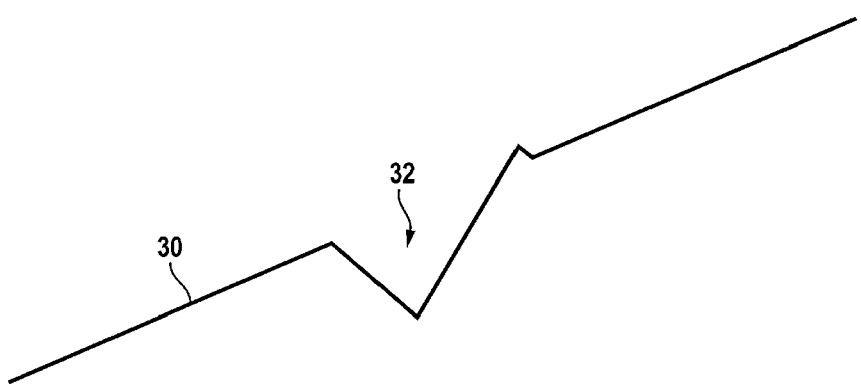
FIG. 6 shows a waveform demonstrating a glitch caused at the crossover known in the art.
Figure 9:
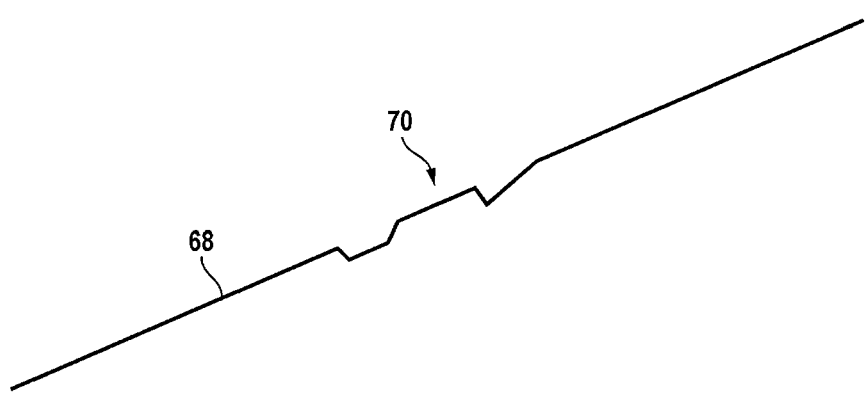
FIG. 9 shows a waveform demonstrating the significantly reduced glitch caused at the crossover.

FIG. 9 illustrates a waveform of the composite output 68 of the positive side of the amplifier, particularly showing the glitch(es) 70 which are significantly reduced versus those of FIG. 6.

This method reduces the glitch related distortion in two ways. First, the overall switching distortion is minimized by creating multiple smaller glitches spread over time, rather than one large, instantaneous glitch. The multiple smaller glitches are easier to filter out than the one large glitch, even if they are of the same total energy. Second, spreading out the glitch energy over a period of time allows some of the glitch energy frequency components to come inside the amplifier bandwidth, where the negative feedback mechanisms of the amplifier will help remove or suppress their effect and reduce the resulting distortion.

In one embodiment, the threshold voltage not only tracks the supply, which is important as the supply may droop significantly under load, but it is also made dynamic because the optimum point to switch between rails is both load and process/temperature dependent. Some embodiments include a small replica of the output stage, which is monitored so that when it loses transfer gain, as when it starts to saturate or come out of saturation, it triggers the switching process.

Some embodiments may also include a state machine and provide for some amount of hysteresis that forces a complete transfer from the inner to the outer rails and vice versa before allowing it to switch back, to prevent oscillatory behavior.

Figure 10:
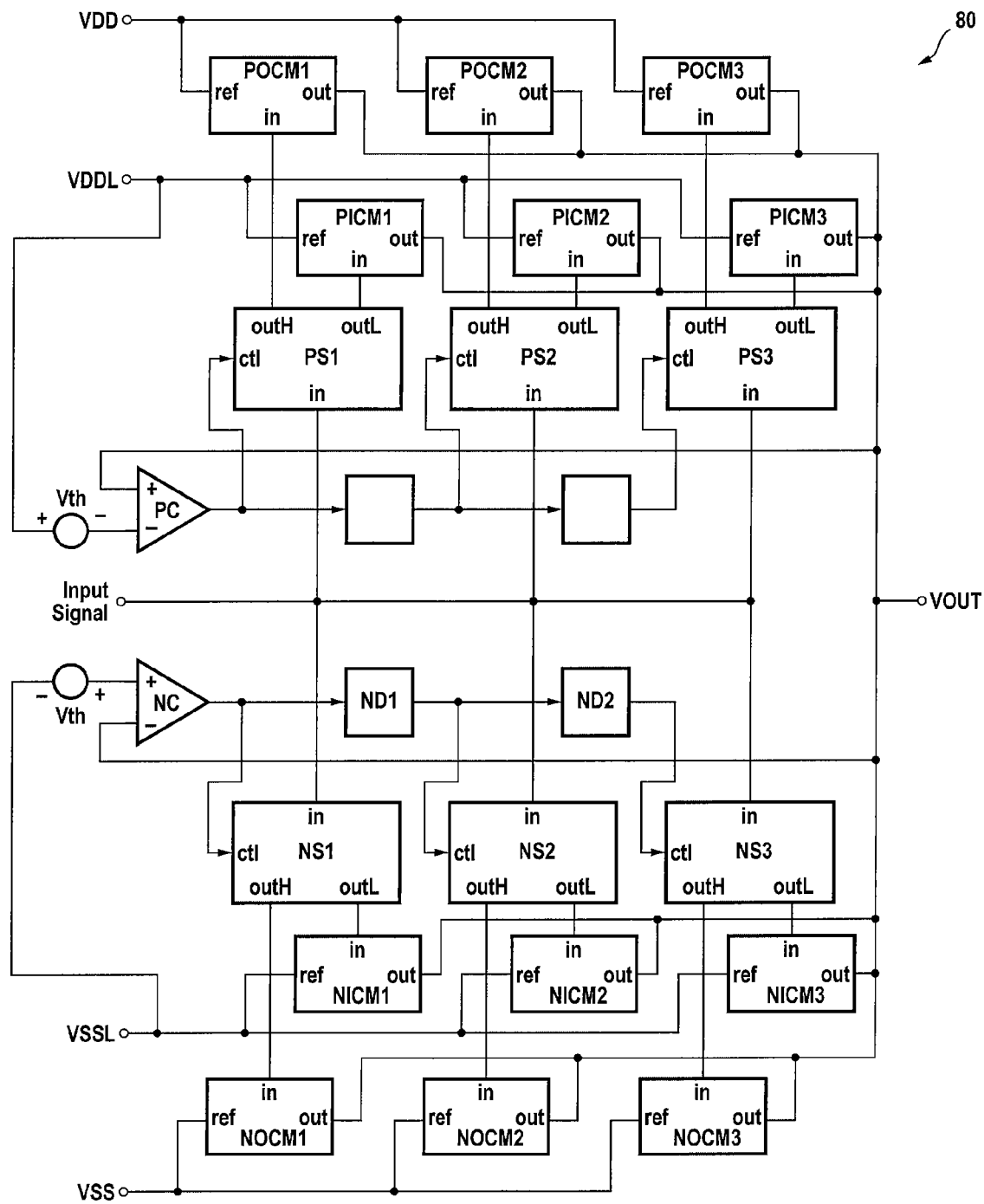
FIG. 10 shows an amplifier according to the principles of FIG. 7, having both positive and negative sides.

FIG. 10 illustrates an amplifier 80 according to another embodiment of this invention, similar to that of FIG. 7 but further illustrating both positive and negative sides. The positive side includes a positive side comparator PC which provides a switch selection signal to a first positive side switch PS. That signal is also fed to a first positive side delay element $PD_1$ which controls a second positive side switch $PS_2$. That delayed signal is also fed to a second positive side delay element $PD_2$ which controls a third positive side switch $PS_3$. The positive side switches $PS_1$, $PS_2$, and $PS_3$ switch the input signal to either their positive side inner current mirrors $PICM_1$, $PICM_2$ and $PICM_3$, respectively, or to their positive side outer current mirrors $POCM_1$, $POCM_2$ and $POCM_3$, respectively. The positive side inner current mirrors are fed a $V_{DDL}$ reference voltage, and the positive side outer current mirrors are fed a $V_{DD}$ reference voltage. The outputs of the positive side current mirrors are coupled in parallel to the $V_{OUT}$ output node.

The amplifier's negative side is a mirror image of its positive side and includes a negative side comparator NC, negative side delay elements $ND_1$ and $ND_2$, negative side inner current mirrors $NICM_1$, $NICM_2$ and $NICM_3$ which are fed a $V_{SSL}$ reference voltage, and negative side outer current mirrors $NOCM_1$, $NOCM_2$, and $NOCM_3$ which are fed a $V_{SS}$ reference voltage. The outputs of the negative side current mirrors are also coupled in parallel to the $V_{OUT}$ output node.

Figure 11:
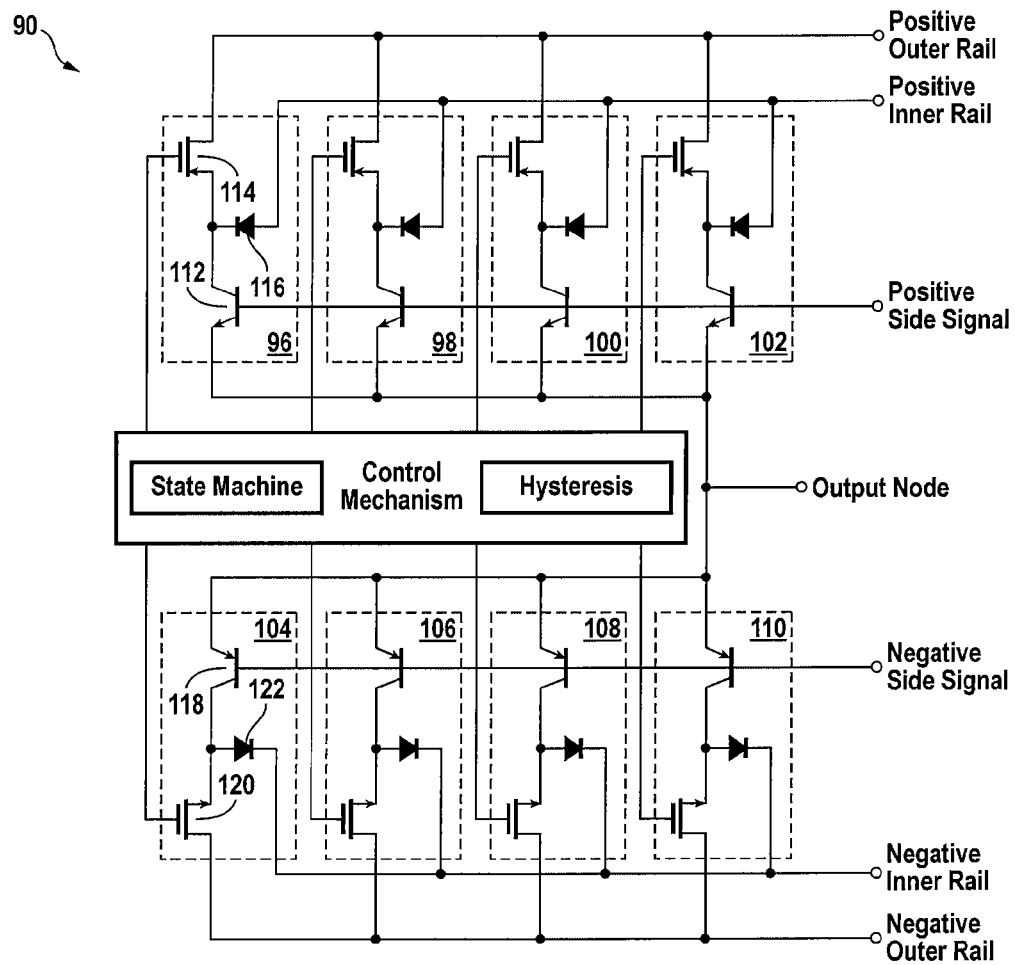
FIG. 11 shows an amplifier according to another embodiment of this invention.

FIG. 11 illustrates an amplifier stage 90 according to another embodiment of this invention. The amplifier stage includes a control mechanism, which may optionally include a state machine and/or a hysteresis mechanism for providing a set of staggered control output signals which accomplish the goal of staggering the switching of multiple amplifier devices over time to reduce glitching and to spread it over time to cause some of its radiation content to fall within the frequency range of the overall system's noise removal abilities (not shown).

The amplifier stage includes a positive side, shown above the control mechanism, and a negative side, shown below the control mechanism. The positive side includes a plurality of output devices 96, 98, 100, 102, and the negative side includes a plurality of output devices 104, 106, 108, 110. The amplifier stage is coupled to a positive outer rail, positive inner rail, negative inner rail, and negative outer rail which may be, for example, +3v, +2v, −2v, and −3v, respectively.

Each positive side output device includes a voltage follower such as an npn bipolar transistor 112 which provides an amplification according to its size, and has its emitter coupled to the amplifier stage's output node. The npn bipolar transistors of the various positive side output devices can be of different sizes, to provide different multiplication factors, as described above. The base of each bipolar transistor is coupled to receive a positive side signal, which is the input signal to be amplified e.g., $V_{INP}$.

Each positive side output device further includes a PMOS FET transistor 114 which serves as a binary switch. The gate of the FET is coupled to receive one of the control signals from the control mechanism. The source of the FET is coupled to the positive outer rail. The drain of the FET is coupled to the collector of the npn bipolar transistor.

Each positive side output device further includes a diode 116 whose anode is coupled to the positive inner rail and whose cathode is coupled to the drain of the FET and to the collector of the bipolar transistor.

When the FET is switched on, the bipolar transistor is coupled to the positive outer rail. The diode is reverse biased and prevents current from flowing from the positive outer rail to the positive inner rail. When the FET is switched off, the diode is not reverse biased, and the bipolar transistor is coupled to the positive inner rail (less a junction drop through the diode, so the positive inner rail may be set one junction drop higher than the desired level, to compensate).

Each negative side output device includes a voltage follower such as a PNP bipolar transistor which provides an amplification according to its size and has its emitter coupled to the amplifier stage's output node and its base coupled to receive a negative side signal e.g. $V_{INN}$, an NMOS FET transistor which serves as a switch, and a diode, as shown. When the FET is turned on, the bipolar transistor is coupled to the negative outer rail, and when the FET is turned off, the bipolar transistor is coupled to the negative inner rail.

The amplifier devices contribute in parallel to the amplification of the signal. By staggering the switching of the various devices from the outer rail to the inner rail, or vice versa, the control mechanism spreads glitching out over time.

Some power is wasted in the diodes, but if this is significant in the context of the application at hand, the diodes could be replaced with FETs, and any or all of the FETs could be replaced with other switching devices, with appropriate enhancements to the control mechanism to e.g. enforce "break before make" connection rules. The diode is simply an economic, simple way to prevent/current from flowing from the outer rail to the inner rail.

Figure 12:
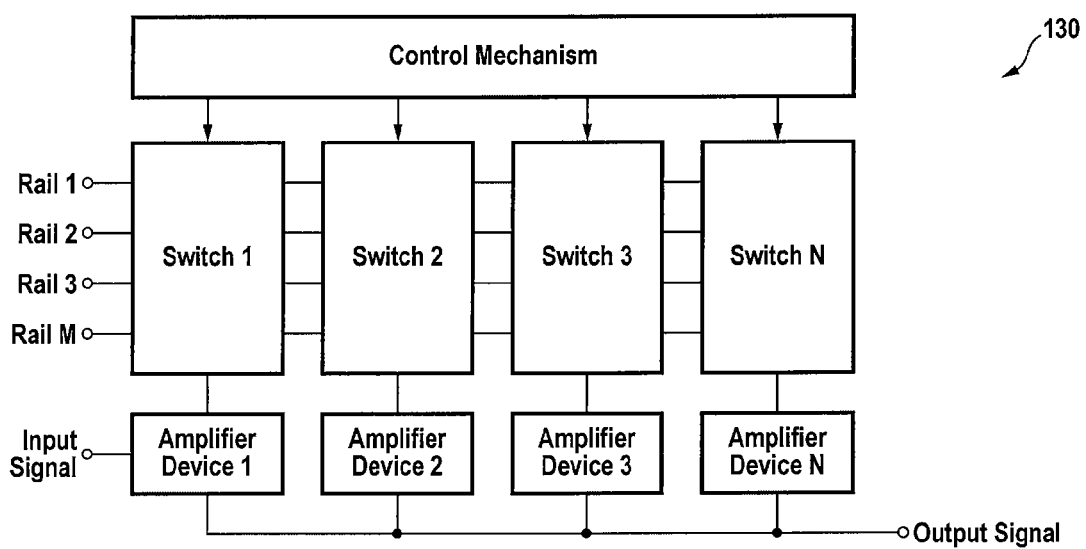
FIG. 12 illustrates a generalized amplifier system according to this invention.

FIG. 12 illustrates a generalized amplifier system 130 according to this invention. A plurality of switches are coupled to corresponding ones of a plurality of amplifier devices. A control mechanism has individual control over the switches, to shift the amplifier system as a whole from one of a plurality of power rails to another, but to do it gradually, by not shifting all of the amplifier devices to the new power rail at the same time. The amplifier devices are all coupled to receive the input signal and to contribute to the output signal. The control mechanism staggers its manipulation of the switches over time, to spread the shift out and reduce glitching.

Although the more detailed embodiments explained above have shifted between two power rails (on e.g. the positive side), this invention may be practiced using two, three, four, or more power rails.

By way of clarification, when one component is said to be "adjacent" another component, it should not be interpreted to mean that there is absolutely nothing between the two components, only that they are in the order indicated.

The various features illustrated in the figures may be combined in many ways, and should not be interpreted as though limited to the specific embodiments in which they were explained and shown.

Those skilled in the art, having the benefit of this disclosure, will appreciate that many other variations from the foregoing description and drawings may be made within the scope of the present invention. Indeed, the invention is not limited to the details described above. Rather, it is the following claims including any amendments thereto that define the scope of the invention.

What is claimed is:

1. An amplifier stage comprising:
   an input node for receiving an input signal;
   an output node for providing an amplified output signal;
   a plurality of outer power rails;
   a plurality of inner power rails;
   a plurality of amplifier devices, each amplifier devices comprising a voltage follower and having,
      an input coupled to the input node,
      an output coupled to the output node; and
      a control mechanism coupled to the amplifier devices to selectively and individually control whether and when each amplifier device is coupled to the outer power rails and the inner power rails, wherein the control mechanism comprises:
   plurality of switches each coupled to a respective one of the amplifier devices; and
   a delay having an input coupled to receive a signal initiating a shift of the amplifier stage from selected ones to the others of the outer power rails and the inner power rails, and including a series of delay elements each coupled to respective ones of the switches.

2. The amplifier stage of claim 1 wherein the control mechanism further comprises:
   a state machine coupled to selectively, individually operate the switches.

3. The amplifier stage of claim 1 wherein each amplifier device comprises:
   a current mirror.

4. The amplifier stage of claim 1 further including:
   a state machine including means for establishing hysteresis that forces a complete transfer of power supply voltage between the inner rails and the outer rails before allowing power supply voltage to switch back, to prevent oscillatory behavior.

5. A method of amplifying an input signal to produce an output signal, the method comprising:
   receiving the input signal at a plurality of switches, wherein each switch is coupled to selectably provide the input signal to either a respective one of a plurality of inner amplifier devices or a respective plurality of outer amplifier devices associated with the switch, depending upon a control signal received by the switch;
   comparing the output signal to an inner voltage reference signal which supplies the inner amplifier devices, and, responsive to the comparing,
   if a voltage of the output signal becomes great enough that the inner voltage reference signal is inadequate to provide proper amplification by the inner amplifier devices, sequentially causing the plurality of switches to provide the input signal to their respective associated outer amplifier devices, and
   if the voltage of the output signal becomes small enough that the inner voltage reference signal is adequate to provide proper amplification by the inner amplifier devices, sequentially causing the plurality of switches to provide the input signal to their respective associated inner amplifier devices;
   wherein the sequential causing step is performed by:
   passing a result of the comparing through a series of delay elements, each delay element being coupled to provide its delayed output to a control input of a respective associated one of the switches;
   whereby the series of delay elements staggers switching of the plurality of switches and thereby spreads switching glitches over period of time.

6. The method of claim 5 further comprising:
   performing the receiving, comparing, and alternative sequentially causing steps in both a positive side and a negative side of an amplifier.

7. The method of claim 5 further comprising:
   performing the receiving, comparing, and alternative sequentially causing steps in both a positive side and a negative side of an amplifier.

8. The method of claim 5 further including:
   employing hysteresis to force a complete transfer of power supply voltage between the inner rails and the outer rails before allowing power supply voltage to switch back, to prevent oscillatory behavior.

* * * * *